(12) United States Patent
Nishimura et al.

(10) Patent No.: US 8,362,427 B2
(45) Date of Patent: Jan. 29, 2013

(54) ELECTRON BEAM IRRADIATION APPARATUS AND ELECTRON BEAM DRAWING APPARATUS

(75) Inventors: Shinsuke Nishimura, Kawasaki (JP); Munehiro Ogasawara, Hiratsuka (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/240,242

(22) Filed: Sep. 22, 2011

(65) Prior Publication Data

US 2012/0235054 A1    Sep. 20, 2012

(30) Foreign Application Priority Data

Mar. 17, 2011    (JP) ................. 2011-059826

(51) Int. Cl.
*H01J 37/26*        (2006.01)
(52) U.S. Cl. ..................... 250/310; 250/397
(58) Field of Classification Search .......... 250/310, 250/397
See application file for complete search history.

(56) References Cited

U.S. PATENT DOCUMENTS 6,172,364 B1    1/2001 Ogasawara et al.
7,095,699 B2 *  8/2006 Miura et al. ................ 369/101

FOREIGN PATENT DOCUMENTS

| JP | 10-92370 | 4/1998 |
|---|---|---|
| JP | 11-54390 | 2/1999 |
| JP | 11-251223 | 9/1999 |
| JP | 2000-123776 A | 4/2000 |

OTHER PUBLICATIONS

Ogasawara, et al., "Reduction of long range fogging effect in a high acceleration voltage electron beam mask writing system"; J. Vac. Sci. Technol. B 17(6), Nov./Dec. 1999, pp. 2936-2939.
Shimomura, et al., "Reduction of Fogging Effect Caused by Scattered Electrons in an Electron Beam System", SPIE Symposium on Photomas and X-Ray Mask Technoloogy VI, Sep. 1999, SPIE vol. 3748, pp. 408-415.

* cited by examiner

*Primary Examiner* — Kiet T Nguyen
(74) *Attorney, Agent, or Firm* — Ohlandt, Greeley, Ruggiero & Perle, L.L.P.

(57) ABSTRACT

According to one embodiment, an electron beam irradiation apparatus comprises an objective lens configured to irradiate a specimen surface with an electron beam, an electron detector which is provided between the objective lens and the specimen surface and which is configured to detect reflected electrons or secondary electrons emitted from the specimen surface, and an antireflection mechanism which is provided between the electron detector and the specimen surface. The antireflection mechanism has a plurality of holes following spiral trajectories of reflected electrons or secondary electrons emitted from the specimen surface and is configured to prevent the reflected electrons or secondary electrons from being re-reflected toward the specimen surface and to direct a part of the reflected electrons or secondary electrons to the electron detector.

19 Claims, 10 Drawing Sheets

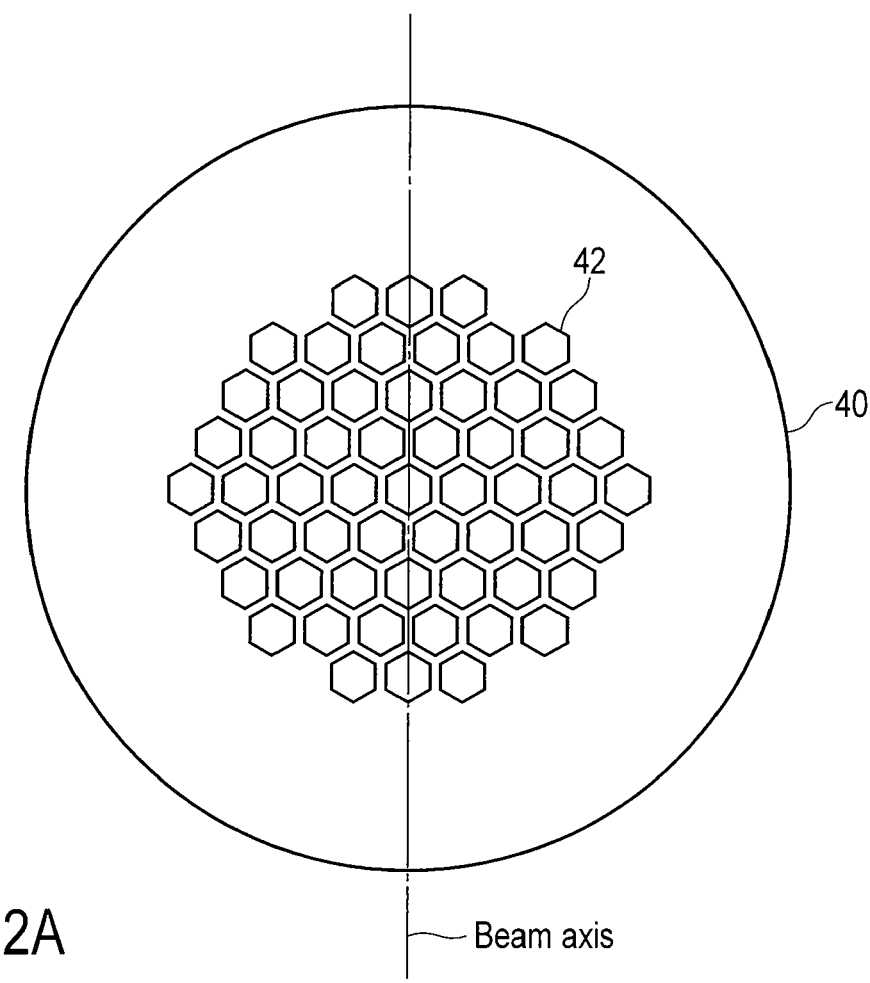
F I G. 2A
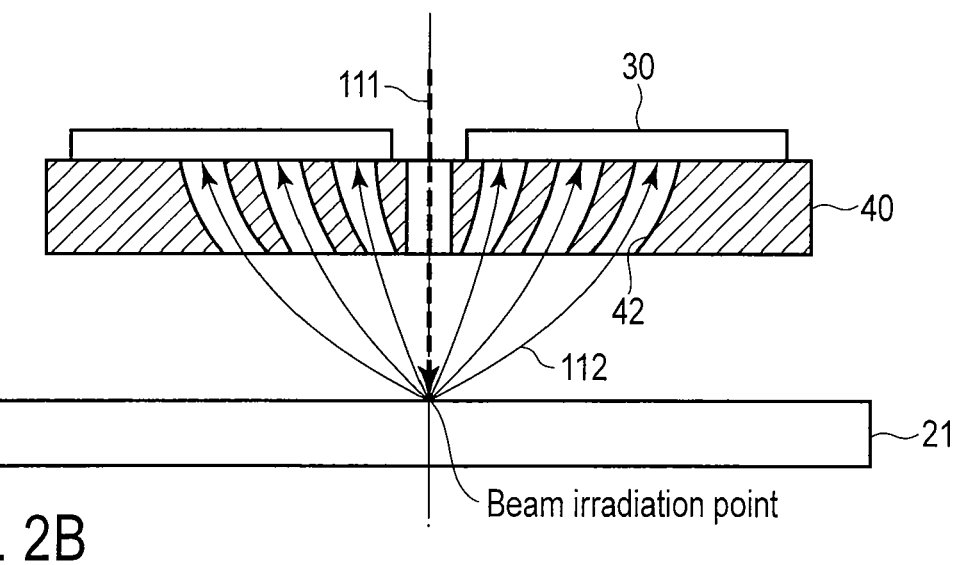
F I G. 2B

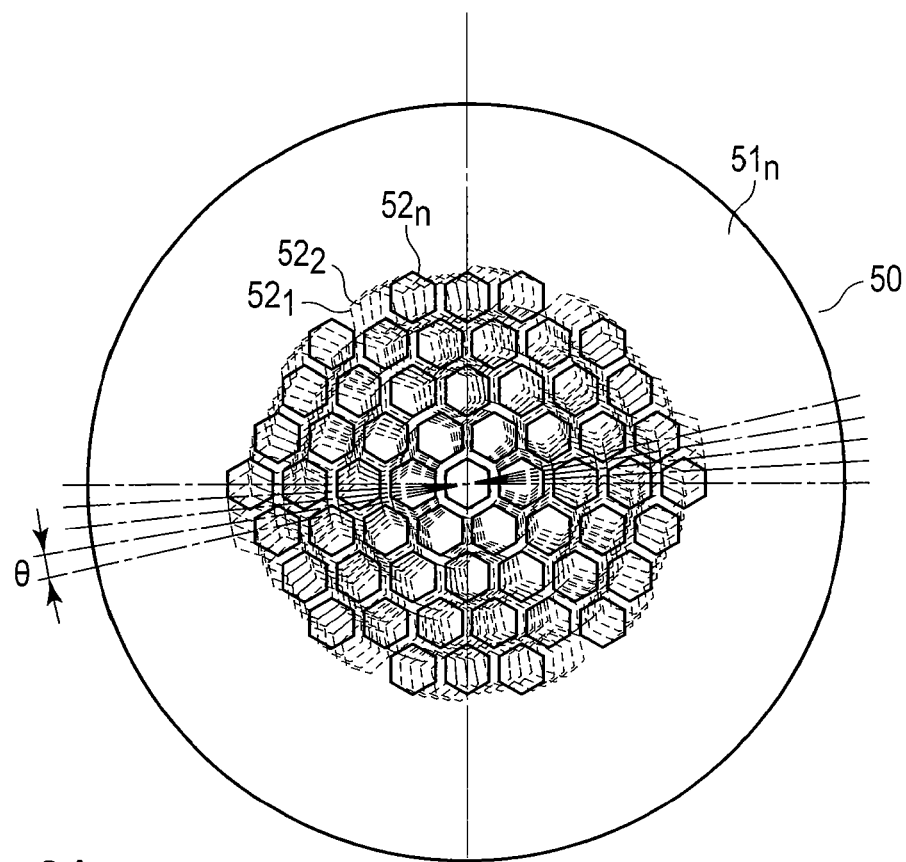
F I G. 3A
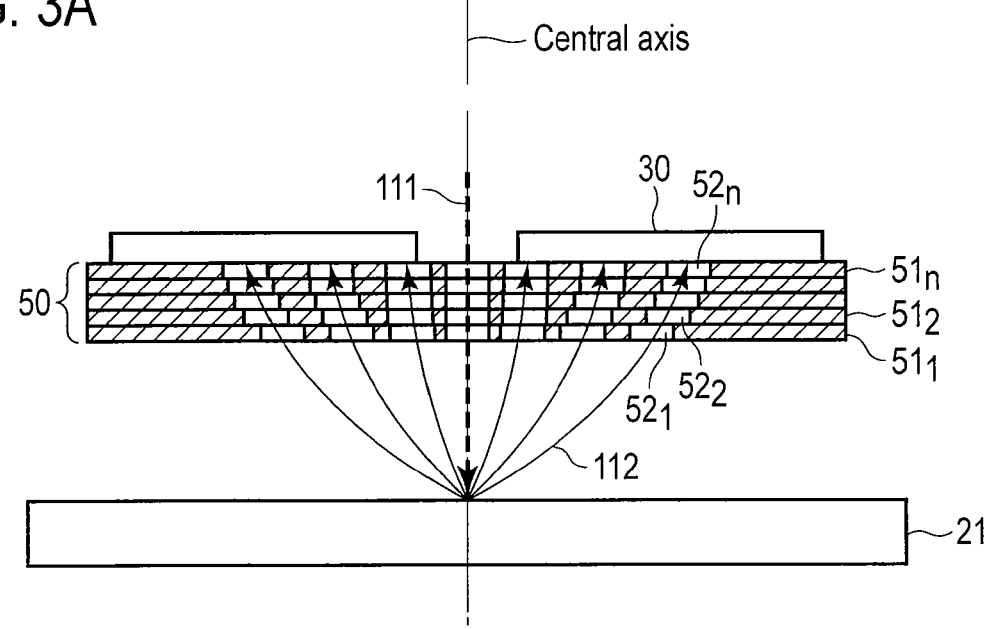
F I G. 3B

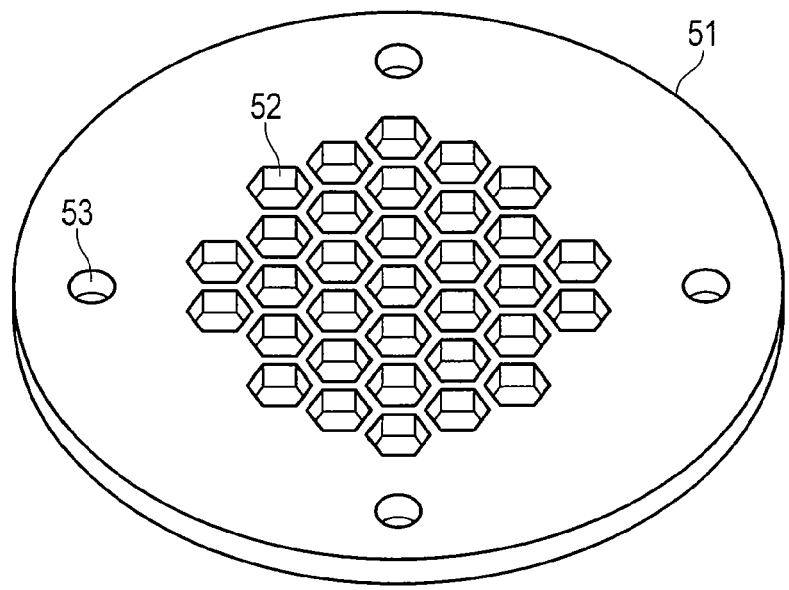
F I G. 4A
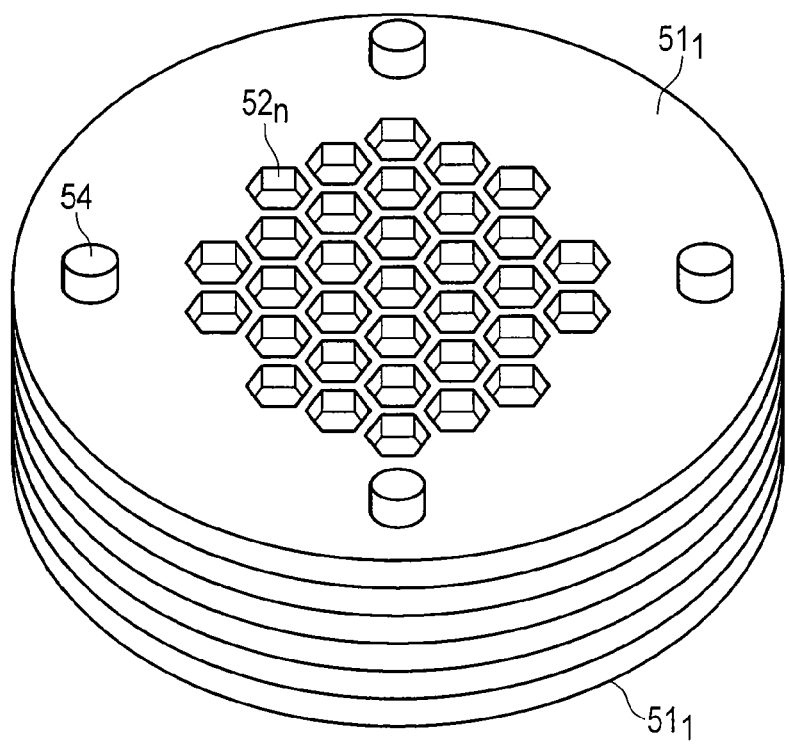
F I G. 4B

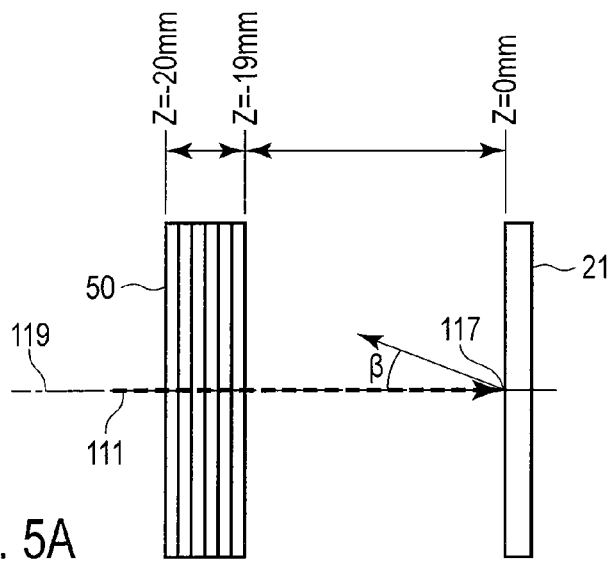
F I G. 5A
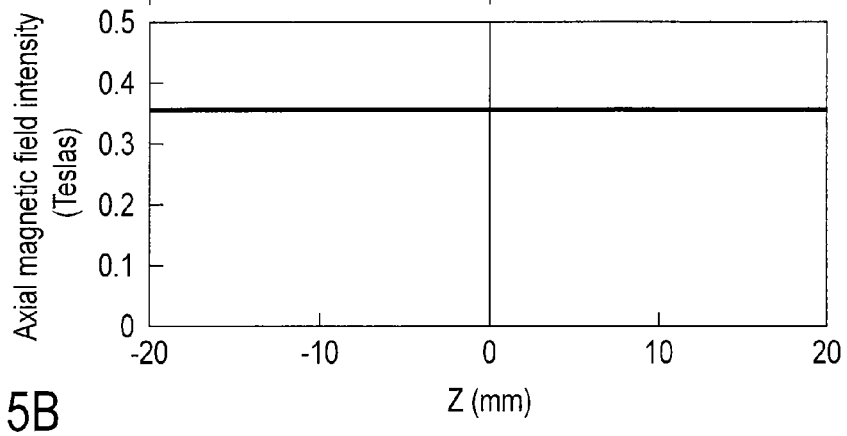
F I G. 5B
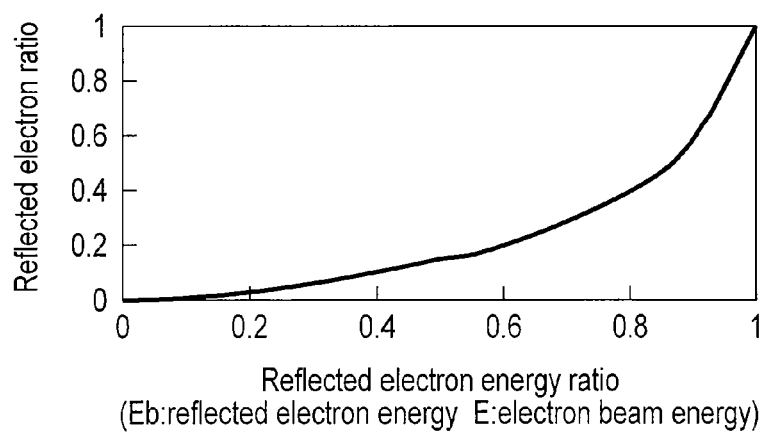
F I G. 6

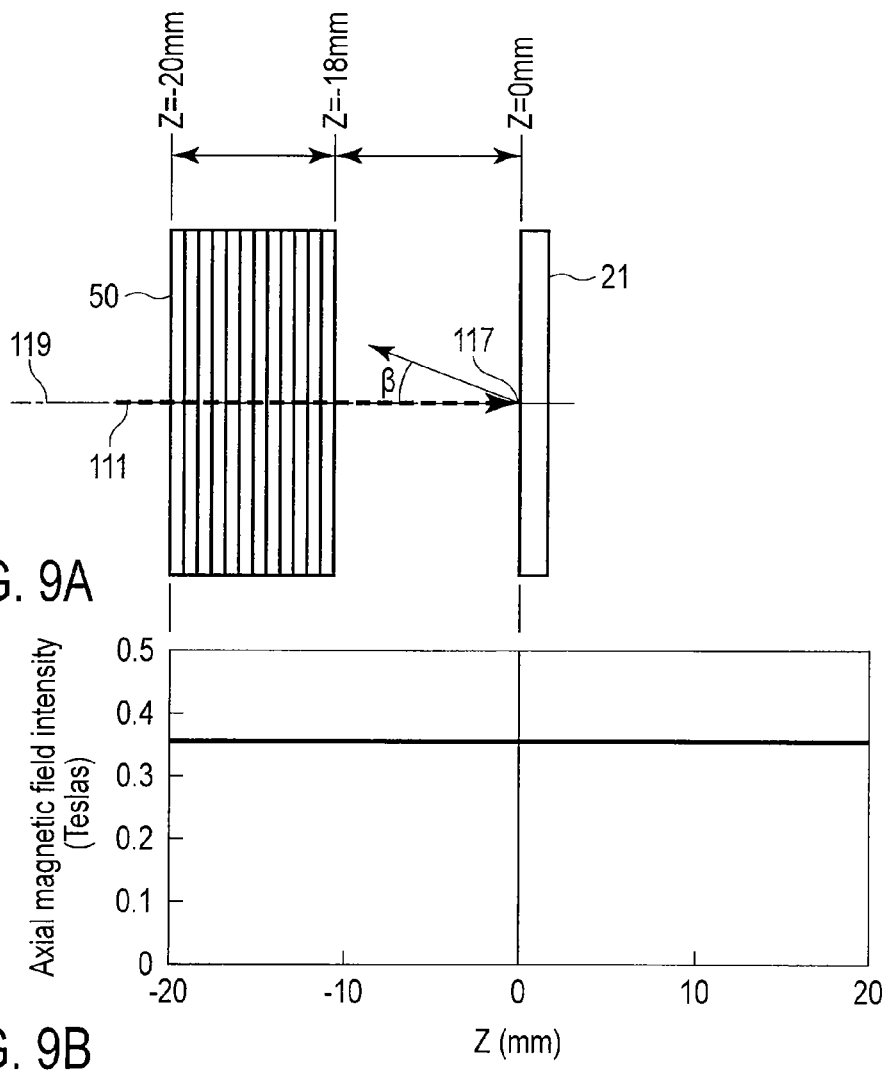
FIG. 9A
FIG. 9B
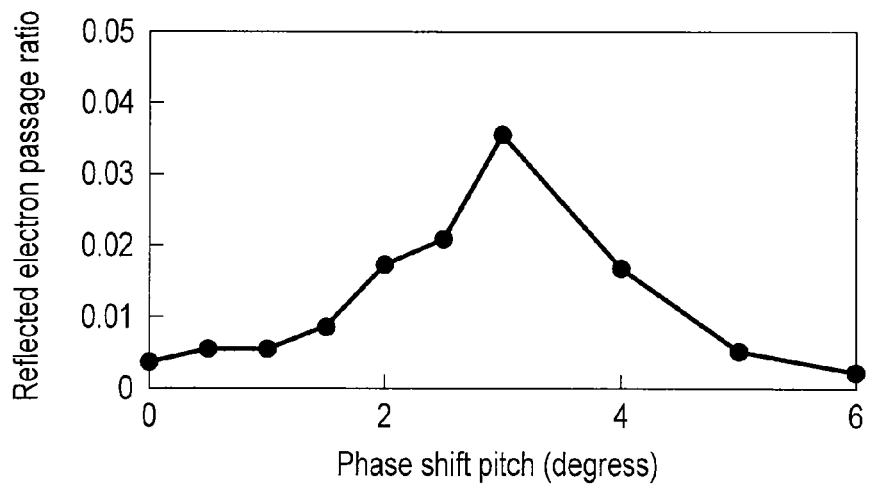
FIG. 10

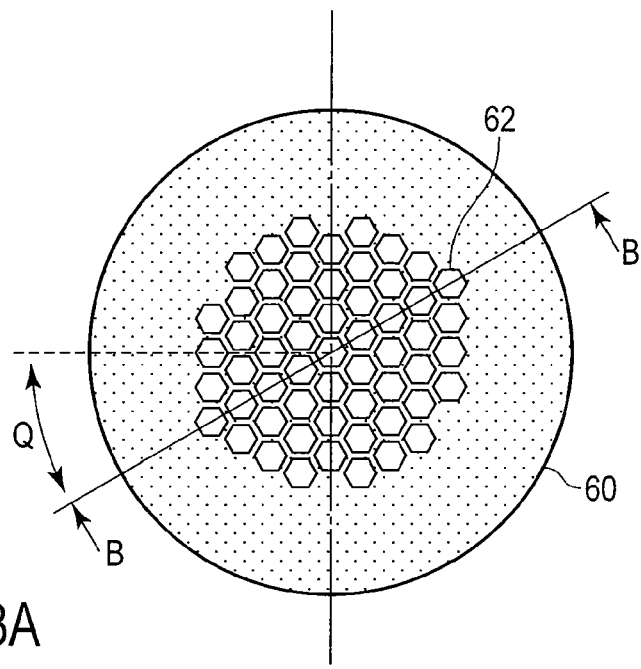
F I G. 13A
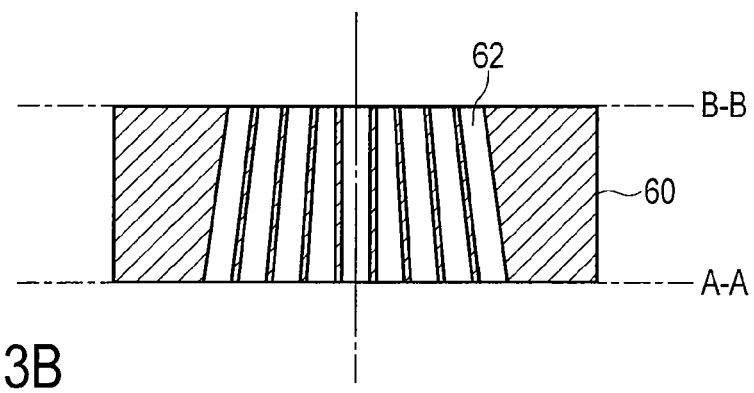
F I G. 13B
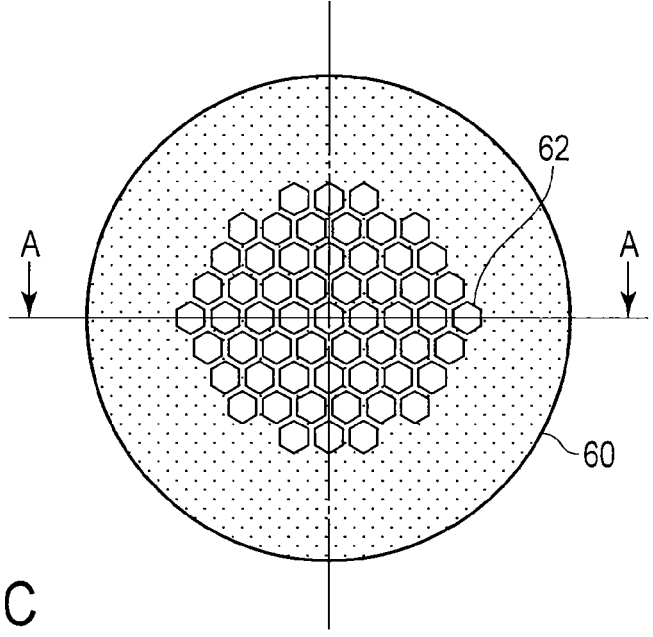
F I G. 13C

ELECTRON BEAM IRRADIATION APPARATUS AND ELECTRON BEAM DRAWING APPARATUS

CROSS-REFERENCE TO RELATED APPLICATIONS

This application is based upon and claims the benefit of priority from prior Japanese Patent Application No. 2011-059826, filed Mar. 17, 2011, the entire contents of which are incorporated herein by reference.

FIELD

Embodiments described herein relate generally to an electron beam irradiation apparatus and an electron beam drawing apparatus which have improved an antireflection mechanism which prevents reflected electrons or secondary electrons emitted from a specimen surface from being re-reflected toward the specimen surface.

BACKGROUND

In an electron beam drawing apparatus, electrons reflected or scattered at the surface of a specimen are reflected again by the bottom surface of an objective lens. The re-reflected electrons expose the resist on the specimen surface excluding the place which an electron beam has entered. Such exposure leads to a decrease in the drawing accuracy. To prevent this, an antireflection plate made of a low atomic number material, such as carbon, is placed below the objective lens. In the antireflection plate, holes are made to suppress the occurrence of re-reflected electrons and direct a part of reflected electrons to an electron detector.

In recent years, electron beam drawing apparatuses have been required to have a higher beam resolution due to further miniaturization of patterns. Therefore, such an object lens as causes the peak of an axial magnetic field intensity to approach the specimen surface has been used. In this case, the trajectory of a reflected electron from the position of the specimen surface is not linear, but spiral due to the effect of a magnetic field. Therefore, reflected electrons can hardly pass through linear holes which are made in the antireflection plate so as to widen upstream or through linear holes perpendicular to the specimen surface. For this reason, with an electron beam drawing apparatus which causes the objective lens to produce the peak of an axial magnetic field intensity near the specimen surface, the detectable amount of reflected electrons becomes smaller and the S/N ratio of the detected signal decreases.

BRIEF DESCRIPTION OF THE DRAWINGS

FIGS. 2A and 2B are a plan view and a sectional view showing the configuration of an antireflection mechanism used in the first embodiment, respectively;

FIGS. 3A and 3B are a plan view and a sectional view to explain a main part of an electron beam drawing apparatus according to a second embodiment, respectively;

FIGS. 4A and 4B are perspective views to explain pin holes made in an antireflection plate and positioning pins provided to the plate used in the second embodiment, respectively;

FIGS. 5A and 5B show the configuration of an optical system and an axial magnetic field distribution, respectively, to explain a shift phase of thin plates (also called as plates) and a first calculation example of a reflected electron passage ratio;

FIG. 6 shows a reflected electron energy distribution in FIG. 5;

FIGS. 9A and 9B show the configuration of an optical system and an axial magnetic field distribution, respectively, to explain a shift phase of thin plates and a second calculation example of a reflected electron passage ratio;

FIG. 10 shows the result of calculating a reflected electron passage ratio in FIG. 9;

FIGS. 13A, 13B, and 13C are a plan view, a sectional view, and a plan view to explain the configuration of a main part of an electron beam drawing apparatus according to a third embodiment, respectively.

DETAILED DESCRIPTION

In general, according to one embodiment, an electron beam irradiation apparatus comprises an objective lens configured to irradiate a specimen surface with an electron beam, an electron detector which is provided between the objective lens and the specimen surface and which is configured to detect reflected electrons or secondary electrons emitted from the specimen surface, and an antireflection mechanism which is provided between the electron detector and the specimen surface. The antireflection mechanism has a plurality of holes following spiral trajectories of reflected electrons or secondary electrons emitted from the specimen surface and is configured to prevent the reflected electrons or secondary electrons from being re-reflected toward the specimen surface and to direct a part of the reflected electrons or secondary electrons to the electron detector.

Hereinafter, embodiments will be explained with reference to the accompanying drawings.

First Embodiment

Figure 1:
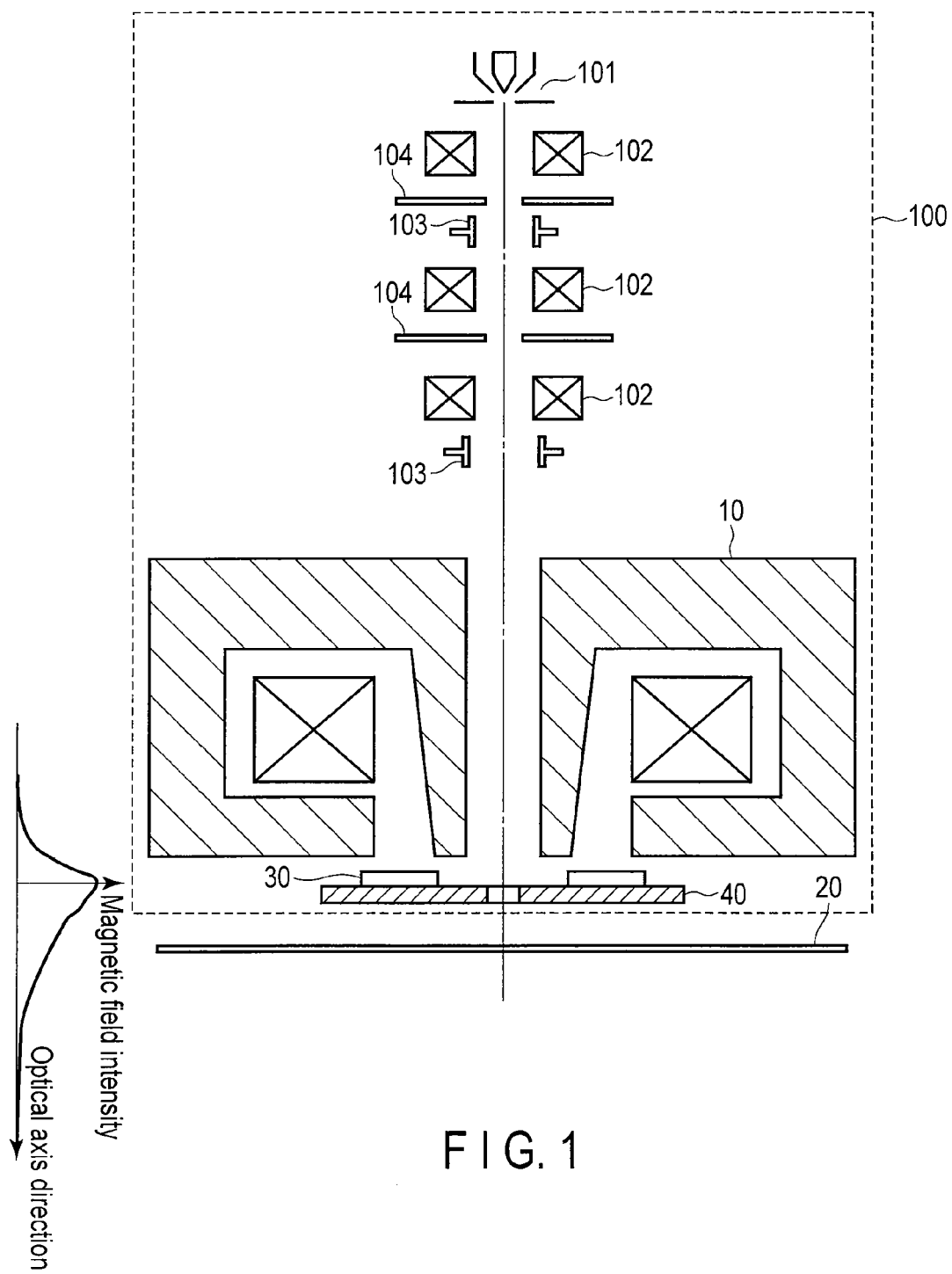
FIG. 1 schematically shows the configuration of an electron beam drawing apparatus according to a first embodiment.

In a schematic configuration of an electron beam drawing apparatus shown in FIG. 1, numeral 10 indicates an objective lens composed of a magnetic coil. To realize a high beam resolution, the objective lens 10 is so configured that the peak of an axial magnetic field intensity comes close to the specimen surface. The objective lens 10 may be, for example, an electromagnetic lens. As shown in FIG. 1, the peak of the axial magnetic field intensity lies between the specimen surface 20 and the objective lens 10. An electron beam from the upstream of the objective lens 10 is concentrated by the objective lens 10 and forms an image on the specimen surface 20.

An electron detector 30 for detecting an electron is placed near the under surface of the objective lens 10 between the objective lens 10 and the specimen surface 20. The electron detector 30 detects a reflected electron at the specimen surface 20 and makes various adjustments of the beam. The electron detector 30 is composed of, for example, a semiconductor detector or a microchannel plate. Between the specimen surface 20 and the electron detector 30, there is provided a plate-like antireflection mechanism 40. The antireflection mechanism 40 prevents an electron reflected at the specimen surface 20 from being re-reflected at the under surface of the objective lens 10 and returning to the specimen surface 20. The antireflection mechanism 40 is made of a low atomic number material. In the antireflection mechanism 40, a plurality of holes are made to suppress the generation of re-reflected electrons and direct a part of reflected electrons to the electron detector 30.

Above the objective lens 10, there is provided an electron optical lens-barrel 100 which houses an electron gun 101, various lenses 102, various deflectors 103, various apertures 104, and others and which is vacuumized. The configuration of the electron optical lens-barrel 100 may be modified variously so as to, for example, form a variable shaped beam or have character apertures. The objective lens 10 is also arranged in the electron optical lens-barrel 100.

FIGS. 2A and 2B show a concrete configuration of the antireflection mechanism 40. The antireflection mechanism 40 has an antireflection effect and further has a high electron passage ratio. As shown by a plan view of FIG. 2A, a plurality of holes 42 in the antireflection mechanism 40 have a honeycomb structure to make the open area ratio larger. In addition, a hole 42 in the antireflection mechanism 40 is configured to follow a spiral trajectory 112 of a reflected electron as shown in a sectional view of FIG. 2B. In FIG. 2B, numeral 21 indicates a specimen placed on the specimen surface and 111 an electron beam entering the specimen surface.

The reason why the antireflection mechanism 40 is needed will be explained. When a specimen is irradiated with an electron beam, the electron reflected at a beam irradiation point is further reflected by the under surface of the objective lens and by the electron detector. Then, the specimen is irradiated with the re-reflected electron. The re-reflected electron leads to an unscheduled irradiation in the electron beam irradiation apparatus, resulting in a fluctuation in the irradiation level. In the electron beam drawing apparatus, a fluctuation in the irradiation level contributes to the deterioration of the dimensional accuracy of a pattern.

Therefore, providing the antireflection mechanism on the under surface of the objective lens prevents re-reflection. In the antireflection mechanism, for example, a plurality of linear holes with a large aspect ratio are made. Reflected electrons are taken into the holes, preventing reflection. Between the under surface of the objective lens and the antireflection mechanism, an electron detector is provided. The electron detector detects a reflected electron passed through a hole in the antireflection mechanism. In the drawing apparatus, a detected electron is used for beam adjustment. If the amount of detected electrons is small, the S/N ratio becomes small, deteriorating the beam adjustment accuracy, which results in the deterioration of drawing accuracy.

Therefore, the antireflection mechanism is required to have an antireflection effect and further has a high electron passage ratio. An example of the structure of the antireflection mechanism has been disclosed in, for example, Jp-A 11-54390 (KOKAI). The apertures of the antireflection mechanism have a honeycomb structure to make the open area ratio larger. The apertures can be made by etching.

In a conventional electron beam drawing apparatus, the objective lens axial magnetic field intensity between the electron detector and the specimen is zero or low, and the trajectory of a reflected electron is about linear. Therefore, even the linear holes can take in reflected electrons sufficiently.

In contrast, when an objective lens that makes the peak of the axial magnetic field intensity get closer to the specimen surface is used, a reflected electron trajectory from the position of the specimen surface is not linear, but spiral due to the effect of a magnetic field. Therefore, reflected electrons can hardly pass through linear holes which widen upstream. Therefore, calculations and experiments have shown that the linear holes perpendicular to the specimen surface permit only about 1% of all the reflected electrons to pass through, though a part of the reflected electrons pass through.

Accordingly, the problem of deterioration of S/N in detecting electrons is solved by suitably modifying the shape of each hole 42 in the antireflection mechanism. Specifically, when the axial magnetic field of the objective lens is applied between the surface of the specimen 21 and the electron detector 30 and reflected electrons follow a spiral trajectory under the influence of the magnetic field, the holes 42 in the antireflection mechanism 40 are shaped so as to follow a spiral trajectory 112. By doing this, the passage ratio of reflected electrons is made higher.

FIGS. 2A and 2B show an example of causing the spiral trajectories 112 of reflected electrons to coincide with the spiral holes 42. Since the trajectories of reflected electrons differ from one another, depending on the output angle and energy of each reflected electron, it is difficult to manufacture an antireflection mechanism 40 that makes the shapes of the holes 42 coincide completely with the trajectories of all the reflected electrons. Therefore, actually, a spiral angle at which the passage ratio of all the reflected electrons becomes the maximum is used. As shown in FIG. 2B, a trajectory farther away from the beam axis has a larger curvature. Therefore, the passage ratio of a reflected electron can be made higher by making the curvature of an outer spiral larger and that of an inner spiral smaller.

As described above, with the first embodiment, since a plurality of holes 42 following the spiral trajectories 112 of reflected electrons emitted from the specimen surface have been made in the antireflection mechanism 40, this prevents reflected electrons from being re-reflected and increases the passage ratio of reflected electrons. Therefore, the amount of electrons detected by the electron detector 30 can be increased and the S/N ratio of a detection signal detected by the electron detector 30 can be improved. Accordingly, the drawing accuracy can be improved.

Second Embodiment

Next, an electron beam drawing apparatus according to a second embodiment will be explained with reference to FIGS. 3A and 3B. The configuration of an objective lens 10 and the remaining electron optical system is the same as that of the first embodiment and an explanation of it will be omitted.

As explained in the first embodiment, the trajectory of a reflected electron has a larger curvature as it is farther away from the beam axis as shown in FIG. 2B. Therefore, the passage ratio of reflected electrons can be made higher by making the curvature of an outer spiral larger and that of an inner spiral smaller. However, it is difficult to make such a hole in a single plate.

In the second embodiment, to overcome this difficulty, a plurality of thin plates are stacked one on top of another as shown in a plan view of FIG. 3A and a sectional view of FIG. 3B to realize the above hole.

A plurality of (an n number of) thin plates 51 in each of which a plurality of openings (holes) 52 are made axisymmetrically with respect to the central axis (beam axis) are prepared. The thin plates 51 ($51_1$ to $51_n$ where n is a natural number) are stacked one on top of another so as to make a θ (degree) phase shift in a circumferential direction, centering on a position with which the optical axis of an electron beam 111 is caused to align. For example, with thin film $51_1$ located at the most downstream of the electron beam 111 as a reference, the symmetric axes of thin plates $51_2$ to $51_n$ are aligned with one another and thin plates $51_2$ to $51_n$ are stacked one on top of another, while being turned in units of θ. The openings 52 have a honeycomb structure. The positions of the openings 52 ($52_1$ to $52_n$) are the same in the individual thin plates $51_1$ to $51_n$.

The stacking phase positioning is performed by pins as shown in FIGS. 4A and 4B. As shown in FIG. 4A, pin holes 53 for positioning are made in the peripheral part of each thin plate 51 differently from the openings 52. The thin plates are shifted in the order in which they are stacked, while the positions are being turned in units of θ. That is, the thin plates are stacked sequentially, starting with the bottom layer upward, while the positions of pin holes 53 are being turned θ×n (n being a natural number, indicating the number of stacked plates). Then, as shown in FIG. 4B, when the thin plates are stacked one on top of another, the pins 54 are inserted in the pin holes 53, positioning the thin plates.

Next, an example of calculating the relationship between the shift amount θ (corresponding to a phase) of a thin plate 51 and the reflected electron passage ratio will be explained with reference to FIGS. 5A and 5B to FIG. 12. In FIG. 5A, the distance between a specimen 21 and an antireflection mechanism 50 was set to 19 mm and the antireflection mechanism 50 was composed of ten 0.1-mm-thick thin plates 51 stacked one on top of another. The electron beam 111 was reflected at a reflection point 117 of the specimen 21 and the angular distribution of reflected electrons was a COS (β) distribution (β being a reflection angle to optical axis Z 119). An axial magnetic field distribution produced by the objective lens 10 was constant at 0.36 Tesla to optical axis Z as shown in FIG. 5B.

FIG. 6 shows an energy distribution of electrons reflected by the specimen 21. The horizontal axis shows the ratio of energy of electrons reflected by the specimen 21 to energy (50 keV) of an electron beam entering the specimen 21. The vertical axis shows a reflected electron ratio of electrons reflected by the specimen 21. As shown in FIG. 6, reflected electrons have various reflected electron ratios and various amounts of reflected electron energy.

The energy of the electron beam 111 was at 50 keV. As for the dimensions of a hole in the antireflection mechanism 50, the opposite face distance of a regular hexagon was 400 μm and its border width was 50 μm.

Figure 7A:
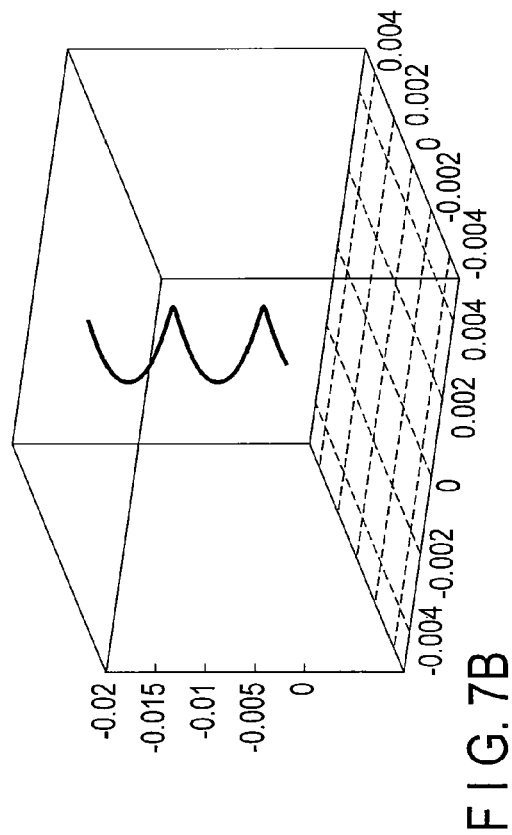
FIGS. 7A, 7B, 7C, and 7D show examples of a trajectory of a reflected electron.
Figure 7B:
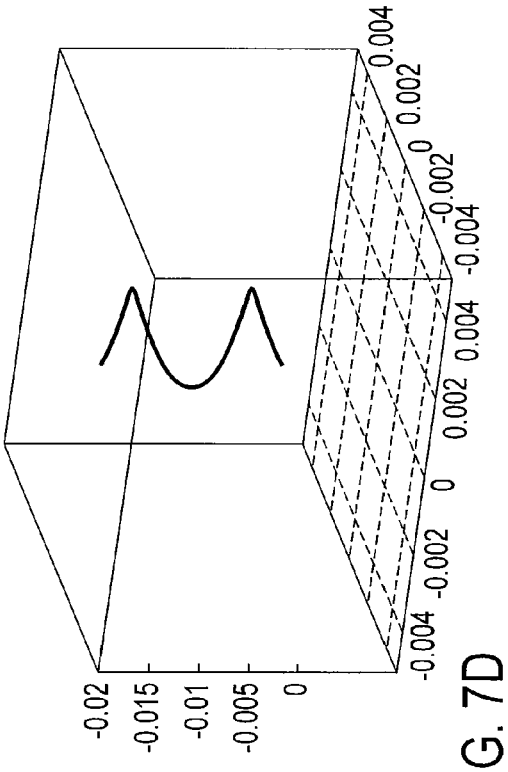
Figure 7C:
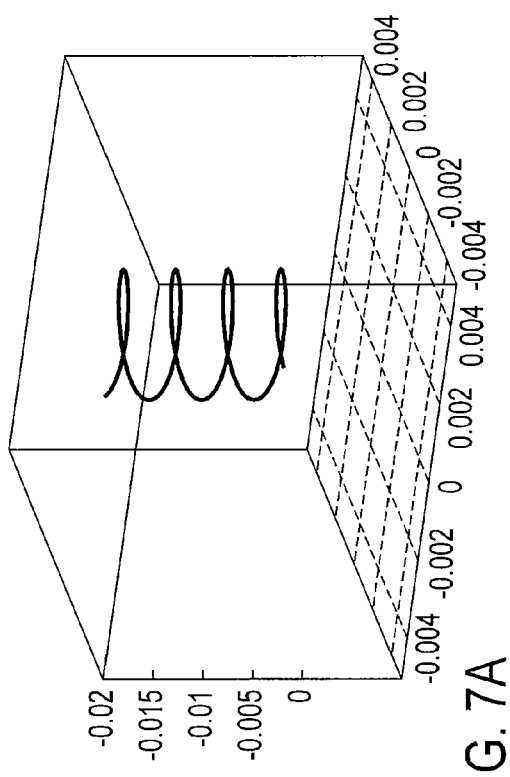
Figure 7D:
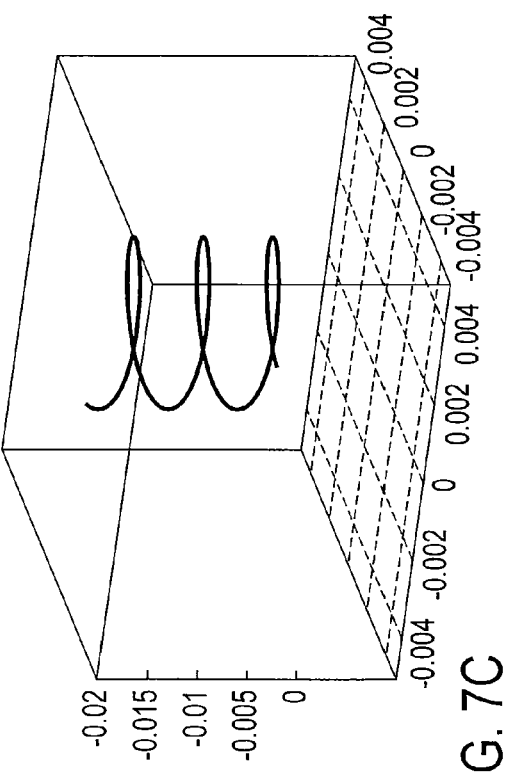

FIGS. 7A to 7D show examples of reflected electron trajectories. FIG. 7A shows a trajectory at a reflected energy of 30 keV with a reflection angle β of 60 degrees. FIG. 7B shows a trajectory at a reflected energy of 30 keV with a reflection angle β of 30 degrees. FIG. 7C shows a trajectory at a reflected energy of 50 keV with a reflection angle β of 60 degrees. FIG. 7D shows a trajectory at a reflected energy of 50 keV with a reflection angle β of 30 degrees. Although a trajectory differs according to reflected energy and reflection angle β, each trajectory draws a spiral going upstream.

Figure 8:
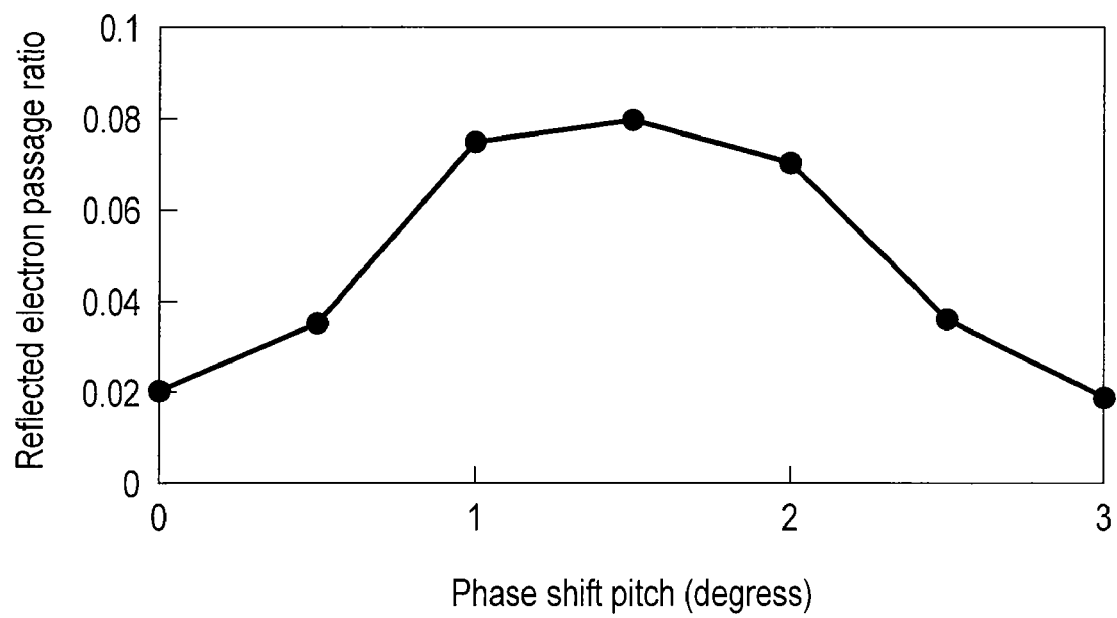
FIG. 8 shows the result of calculating a reflected electron passage ratio in FIG. 5.

FIG. 8 shows the result of calculating the relationship between the phase shift pitch of the thin plates 51 of the antireflection mechanism 50 and the reflected electron passage ratio. The reflected electron passage ratio is the ratio of the number of reflected electrons passed through the antireflection plate to the total number of reflected electrons. When the phase of the thin plates 51 was not shifted, that is, when the linear holes were used, the reflected electron passage ratio was 2%. In contrast, when the phase of the thin plates 51 was shifted, the reflected electron passage ratio increased and reached a maximum of 8% at a phase shift pitch of 1.5 degrees. That is, the reflected electron passage ratio could be increased up to four-fold by shifting the phase of the thin plates 51.

In FIG. 9A, the distance between the specimen 21 and the antireflection mechanism 50 was set to 18 mm and the antireflection mechanism 50 was composed of ten 0.2-mm-thick thin plates 51 stacked one on top of another. An axial magnetic field distribution produced by the objective lens 10 was constant at 0.36 Tesla to optical axis Z as shown in FIG. 9B.

FIG. 10 shows the result of calculating the reflected electron passage ratio in this case. The reflected electron passage ratio was 0.4% at a phase shift pitch of 0 degree. When the phase shift pitch was 3 degrees, the reflected electron passage ratio was 3.6%. The reflected electron passage ratio could be increased up to nine-fold.

This means that, when the magnetic field of the objective lens 10 is strong as far as close to the specimen surface, reflected electrons hardly pass through the antireflection mechanism 50 unless the thin plates 51 for preventing re-reflection are shifted and that stacking the thin plates 51 one on top of another so as to be shifted sequentially enables electrons to be detected sufficiently. That is, stacking the thin plates 51 in a shifted manner as in the second embodiment is effective when the magnetic field of the objective lens 10 is strong as far as near the specimen surface.

Figure 11A:
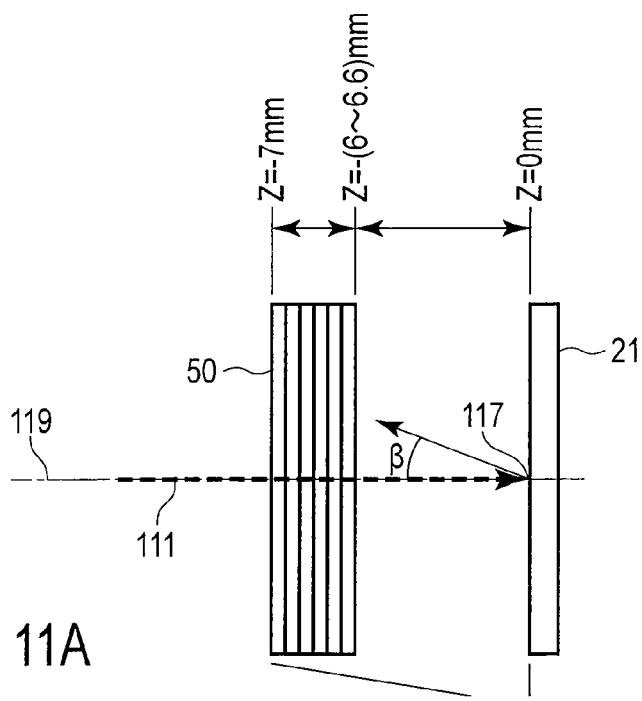
FIGS. 11A and 11B show the configuration of an optical system and an axial magnetic field distribution, respectively, to explain a shift phase of thin plates and a third calculation example of a reflected electron passage ratio.
Figure 11B:
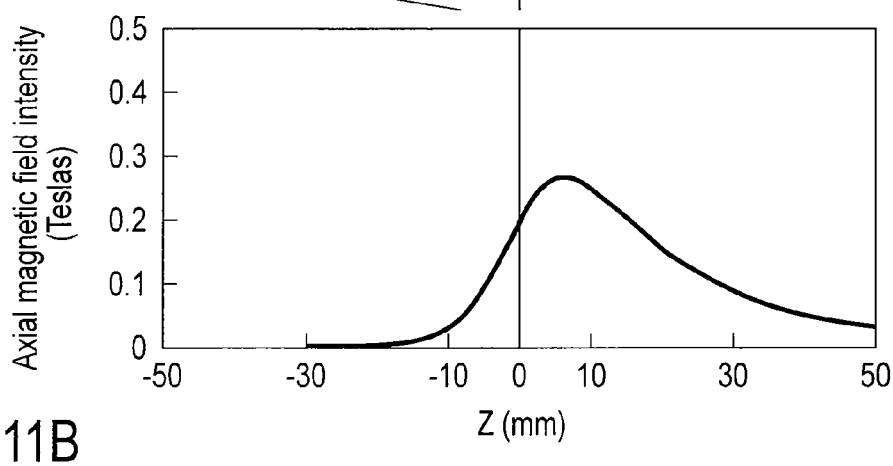

In FIG. 11A, ten, seven, and four 0.1-mm-thick thin plates 51 were stacked one on top of another to form antireflection mechanisms 50. The distance between the specimen 21 and each of the antireflection mechanisms 50 was set to 6 mm, 6.3 mm, and 6.6 mm, respectively. An axial magnetic field distribution produced by the objective lens 10 was not constant as shown in FIG. 11B, but varies greatly near the specimen surface.

Figure 12:
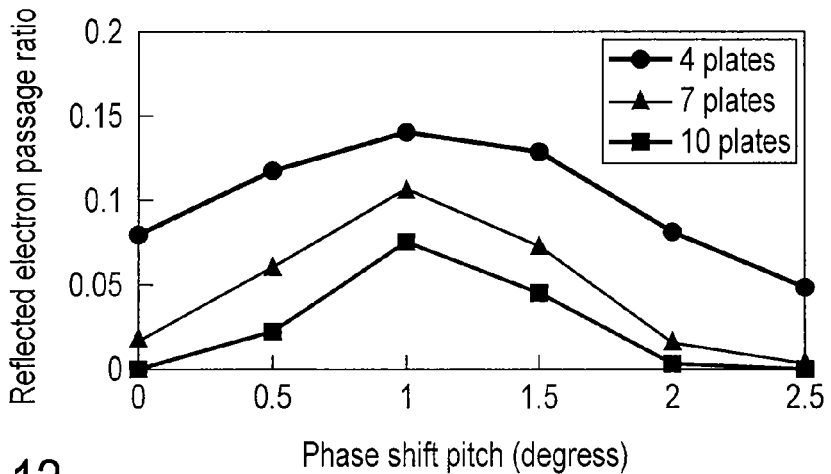
FIG. 12 shows the result of calculating a reflected electron passage ratio in FIG. 11.

FIG. 12 shows the result of calculating the reflected electron passage ratio in this case. As the number of stacked plates became larger, the passage ratio became lower. When the phase shift pitch was 1°, the reflected electron passage ratio became the highest, regardless of the number of stacked plates. As the number of stacked plate is larger, this is more effective in preventing re-reflected electrons from being generated. When the number of stacked plates was ten with a phase shift pitch of 0°, the reflected electron passage ratio was 0.12%. When the number of stacked plates was ten with a phase shift pitch of 1°, the reflected electron passage ratio was 7.6%. That is, shifting the phase increased the reflected electron passage ratio 60-fold.

This means that the peak of the axial magnetic field of the objective lens 10 is formed near the specimen surface and, when ten or more thin plates are stacked one on top of another to prevent re-reflection, reflected electrons hardly pass through the antireflection mechanism 50 unless the thin plates 51 are shifted. In addition, it is seen that shifting the thin plates 51 with a phase shift pitch of 1° enables electrons to be detected sufficiently. That is, as in the second embodiment, stacking the thin plates 51 in a shifted manner is effective when the peak of the axial magnetic field of the objective lens 10 is formed near the objective lens.

The process of making a spiral hole in a single thick plate shown in FIGS. 2A and 2B is difficult, whereas the second embodiment that shifts a stacking phase makes it possible to produce a spiral hole with a large outer curvature and a small inner curvature at low cost. In addition, electrons re-reflected by the electron detector 30 are less liable to return onto the specimen than when a conventional linear hole is used. Therefore, not only the passage ratio but also the antireflection effect can be improved. This is because the antireflection mechanism 50 has a spiral hole following a spiral trajectory of a reflected electron and therefore it is easier for an electron to enter the spiral hole.

As described above, with the second embodiment, since the holes 52 following the spiral trajectories of reflected electrons emitted from the surface of the specimen 21 have been made in the antireflection mechanism 50, a part of the reflected electrons can be directed to the electron detector 30 efficiently. Therefore, not only are reflected electrons emitted from the surface of the specimen 21 prevented from being re-reflected toward the specimen, but also the amount of electrons detected by the electron detector 30 can be increased. This improves the beam adjustment accuracy and therefore contributes to an improvement in the drawing accuracy.

Since the antireflection mechanism 50 is composed of a plurality of thin plates 51 stacked one on top of another, holes following the spiral trajectories of reflected electrons can be realized easily, enabling manufacturing costs to be reduced.

The curvature of a spiral trajectory varies according to the speed of a reflected electron or the magnetic field intensity. In the second embodiment, a variation in the curvature can be dealt with by changing the amount θ of shift between the thin plates 51. Therefore, there is no need to prepare the antireflection mechanism 50 according to the specification of the objective lens 10. The antireflection mechanism 50 may be applied to various types of apparatuses. Since only the positions of the pin holes 53 of the thin plates 51 have to be changed, it is possible to avoid a rise in the cost of producing the thin plates 51.

In the second embodiment, as shown in FIGS. 7A to 7D, it has been assumed that the trajectory of a reflected electron has a constant diameter without getting wider. However, when a magnetic field along the beam axis from the specimen surface to the electron detector 30 changes significantly, reflected electrons diverge or converge, while following spiral trajectories. For example, when the magnetic field intensity peaks at the specimen surface and weakens rapidly as the distance from the specimen surface increases, reflected electrons diverge, while following spiral trajectories. In this case, it is more desirable that the positions of openings in each thin plate with respect to the center be changed according to the stacking position rather than be set with respect to the center.

Third Embodiment

Next, an electron beam drawing apparatus according to a third embodiment will be explained with reference to FIGS. 13A to 13C. FIG. 13A is a diagram when an antireflection mechanism is viewed from the upstream of a beam. FIG. 13C is a diagram when the antireflection mechanism is viewed from the downstream of the beam. FIG. 13B is a sectional view of linear holes which connect the downstream openings taken along line A-A of FIG. 13C with the upstream openings taken along line B-B of FIG. 13A.

Between the bottom face and top face of the antireflection mechanism 60, the positions of openings are shifted by an angle of Q circumferentially, centering on the beam axis. In the antireflection mechanism 60, linear holes 62 that connect the openings in the bottom face with those in the top face are made. Since the positions of the holes 62 are shifted, centering on the beam axis, the shift amount of a hole 62 farther away from the center is larger than that of a hole 62 closer to the center. Therefore, the tilt angle of a hole 62 made in the antireflection mechanism 60 so as to penetrate through the mechanism gets greater from the beam axis toward the outside as shown in FIG. 13B.

A hole 62 in the antireflection mechanism 60 is a linear hole inclining in the same phase direction as a spiral trajectory of a reflected electron or a secondary electron. An outer hole 62 has a larger tilt angle to an axis perpendicular to the bottom face of the antireflection mechanism 60 than an inner hole with respect to the beam axis. That is, a linear hole 62 approximating to the spiral trajectory of a reflected electron is formed. The opening of the hole 62 has a honeycomb structure as in the first embodiment.

The hole 62 penetrates linearly and inclines to similar extent in the same direction as the spiral phase direction of a reflected electron trajectory. The penetration path of a hole 62 farther away from the beam axis (optical axis) tilts greater to the axis perpendicular to the bottom face of the antireflection mechanism 60. The penetration path of a hole 62 closer to the beam axis tilts less to the axis perpendicular to the bottom face of the antireflection mechanism 60. This enables the penetration paths to be approximated to the spiral hole shapes in FIGS. 2A and 2B and FIGS. 3A and 3B, making it possible to increase the reflected electron passage ratio.

MODIFICATION

This invention is not limited to the aforementioned embodiments.

While in the embodiments, each opening has a honeycomb structure, the shape of the opening may be an N-gon or a round shape. While the shift pitch of thin plates has been the same, each shift angle pitch may differ, provided that the reflected electron passage ratio becomes the highest with the pitch. Since the optimum θ differs depending on the thickness of a thin plate, the optimum phase should be used according to the thickness.

While the embodiments have been explained using an electron beam drawing apparatus as an example, the invention is not necessarily restricted to the electron beam drawing apparatus and may be applied to an ion beam drawing apparatus. In addition, the invention is not necessarily limited to the drawing apparatus and may be applied to an apparatus which has a configuration that causes an objective lens to apply an electron beam onto a specimen surface and form an image.

Furthermore, while in the embodiments, reflected electrons from the specimen surface have been explained, there is a similar problem with secondary electrons emitted from the specimen surface as a result of irradiation of energy. Therefore, the invention may be applied not only to reflected electrons but also to the prevention of re-reflection of secondary electrons and the detection of electrons.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electron beam irradiation apparatus comprising:
   an objective lens configured to irradiate a specimen surface with an electron beam;
   an electron detector which is provided between the objective lens and the specimen surface and which is configured to detect reflected electrons or secondary electrons emitted from the specimen surface;

an antireflection mechanism which is provided between the electron detector and the specimen surface and which has a plurality of holes following spiral trajectories of reflected electrons or secondary electrons emitted from the specimen surface and is configured to prevent the reflected electrons or secondary electrons from being re-reflected toward the specimen surface and to direct a part of the reflected electrons or secondary electrons to the electron detector.

2. The apparatus of claim 1, wherein the antireflection mechanism is composed of a plurality of plates each having a plurality of openings in the plate being stacked one on top of another, the openings in the individual plates being connected to one another to form the holes.

3. The apparatus of claim 2, wherein the openings made in the plates have a honeycomb structure.

4. The apparatus of claim 1, wherein the antireflection mechanism is composed of a plurality of the same plates each having a plurality of openings in the plate being stacked one on top of another, the holes assuming shapes following the spiral trajectories by stacking the plates one on top of another in such a manner that a phase is shifted, centering on the axis of the electron beam.

5. The apparatus of claim 4, wherein each of the plates has pin holes for positioning in a peripheral part of the plate, positions of the pin holes being shifted in a circumferential direction in the order in which the plates are to be stacked.

6. The apparatus of claim 4, wherein the openings made in the plates have a honeycomb structure.

7. The apparatus of claim 1, wherein the holes in the antireflection mechanism are linear holes which tilt in the same phase direction as the spiral trajectories of the reflected electrons or secondary electrons when viewed along the axis of the electron beam and an outer one of which has a larger tilt angle to an axis perpendicular to the bottom face of the antireflection mechanism than an inner hole with respect to the axis of the electron beam.

8. The apparatus of claim 7, wherein the openings of the holes in the antireflection mechanism have a honeycomb structure.

9. The apparatus of claim 1, wherein the objective lens is an electromagnetic lens and is configured to produce, near the specimen surface, a peak of a magnetic field in an axis direction of the electron beam generated by the electromagnetic lens.

10. An electron beam drawing apparatus comprising:
an electron optical lens-barrel which has an objective lens arranged in a part that faces a specimen and which is configured to apply an electron beam onto a specimen surface to form a desired pattern;
an electron detector which is provided between the objective lens of the electron optical lens-barrel and the specimen surface and which is configured to detect reflected electrons or secondary electrons emitted from the specimen surface;
an antireflection mechanism which is provided between the electron detector and the specimen surface and which has a plurality of holes following spiral trajectories of reflected electrons or secondary electrons emitted from the specimen surface and is configured to prevent the reflected electrons or secondary electrons from being re-reflected toward the specimen surface and to direct a part of the reflected electrons or secondary electrons to the electron detector.

11. The apparatus of claim 10, wherein the antireflection mechanism is composed of a plurality of plates each having a plurality of openings in the plate being stacked one on top of another, the openings in the individual plates being connected to one another to form the holes.

12. The apparatus of claim 11, wherein the openings made in the plates have a honeycomb structure.

13. The apparatus of claim 10, wherein the antireflection mechanism is composed of a plurality of the same plates each having a plurality of openings in the plate being stacked one on top of another, the holes assuming shapes following the spiral trajectories by stacking the plates one on top of another in such a manner that a phase is shifted centering on the axis of the electron beam.

14. The apparatus of claim 13, wherein each of the plates has pin holes for positioning in a peripheral part of the plate, the positions of the pin holes being shifted in a circumferential direction in the order in which the plates are to be stacked.

15. The apparatus of claim 13, wherein the openings made in the plates have a honeycomb structure.

16. The apparatus of claim 10, wherein the holes in the antireflection mechanism are linear holes which tilt in the same phase direction as the spiral trajectories of the reflected electrons or secondary electrons when viewed along the axis of the electron beam and an outer one of which has a larger tilt angle to an axis perpendicular to the bottom face of the antireflection mechanism than an inner hole with respect to the axis of the beam.

17. The apparatus of claim 16, wherein the openings of the holes in the antireflection mechanism have a honeycomb structure.

18. The apparatus of claim 10, wherein the objective lens is an electromagnetic lens and is configured to produce, near the specimen surface, a peak of a magnetic field in an axis direction of the electron beam generated by the electromagnetic lens.

19. The apparatus of claim 10, wherein the electron optical lens-barrel comprises not only the objective lens but also an electron gun that generates an electron beam, a lens system that focuses an electron beam, an aperture mask that defines a shape of the electron beam, and a deflection system that deflects the electron beam.

* * * * *